United States Patent
Jia et al.

(10) Patent No.: US 12,078,688 B2
(45) Date of Patent: Sep. 3, 2024

(54) STEP VOLTAGE IDENTIFICATION FOR MULTIPLE INPUTS

(71) Applicant: Suzhou Littelfuse OVS Co., Ltd., Suzhou (CN)

(72) Inventors: Yanqiu Jia, Suzhou (CN); Dan Jin, Suzhou (CN); Yu Wang, Suzhou (CN)

(73) Assignee: Suzhou Littelfuse OVS Co., Ltd., Suzhou (CN)

( * ) Notice: Subject to any disclaimer, the term of this patent is extended or adjusted under 35 U.S.C. 154(b) by 99 days.

(21) Appl. No.: 17/783,980

(22) PCT Filed: Dec. 26, 2019

(86) PCT No.: PCT/CN2019/128510
§ 371 (c)(1),
(2) Date: Jun. 9, 2022

(87) PCT Pub. No.: WO2021/128114
PCT Pub. Date: Jul. 1, 2021

(65) Prior Publication Data
US 2023/0009053 A1    Jan. 12, 2023

(51) Int. Cl.
*G01R 31/74* (2020.01)
*G01R 31/00* (2006.01)

(52) U.S. Cl.
CPC ............ *G01R 31/74* (2020.01); *G01R 31/006* (2013.01)

(58) Field of Classification Search
CPC .. G01R 31/74; G01R 31/006; G01R 19/0084; H01H 85/30
See application file for complete search history.

(56) References Cited

U.S. PATENT DOCUMENTS

| | | | | |
|---|---|---|---|---|
| 5,493,101 | A * | 2/1996 | Innes | H02H 3/025 |
| | | | | 219/505 |
| 11,276,476 | B1 * | 3/2022 | Pan | G11C 17/16 |
| 2011/0175699 | A1 | 7/2011 | Huss | |
| 2018/0040381 | A1 * | 2/2018 | Dusa | G11C 17/165 |

(Continued)

FOREIGN PATENT DOCUMENTS

| | | |
|---|---|---|
| CN | 204559232 U | 8/2015 |
| CN | 206564571 U | 10/2017 |
| CN | 108633133 A | 10/2018 |

(Continued)

OTHER PUBLICATIONS

Extended European Search Report mailed Dec. 5, 2022 for corresponding EPO Application No. 19957164.7 filed Dec. 26, 2019.

(Continued)

Primary Examiner — Akm Zakaria
(74) Attorney, Agent, or Firm — KDW FIRM PLLC

(57) ABSTRACT

Provided herein are approaches for determining a status of a fuse. In some embodiments, a system may include a first fuse electrically connected to a first node and to a first resistor, and a second fuse electrically connected to a second node and a second resistor, wherein the first and second fuses are in parallel connection to a same port of a multiplexer. The system may further include a controller communicably connected with the multiplexer, the controller operable to read a voltage level of the first and second nodes.

20 Claims, 3 Drawing Sheets

(56) References Cited

U.S. PATENT DOCUMENTS

2019/0074071 A1* 3/2019 Daanen .................. H10B 69/00
2021/0280515 A1* 9/2021 Iwamizu ............... H01L 29/868

FOREIGN PATENT DOCUMENTS

| DE | 2014224703 | | 6/2016 |
|----|------------|---|--------|
| JP | 59211875 | A | 11/1984 |
| JP | 2008053578 | A | 3/2008 |
| JP | 2008296863 | A | 12/2008 |
| JP | WO2012161007 | A | 7/2014 |
| KR | 20100119336 | A | 11/2010 |
| TW | 200606438 | A | 2/2006 |

OTHER PUBLICATIONS

International Search Report and Written Opinion mailed Aug. 26, 2020 for PCT/CN2019/128510.

* cited by examiner

STEP VOLTAGE IDENTIFICATION FOR MULTIPLE INPUTS

FIELD OF THE DISCLOSURE

The disclosure relates generally to fuses and, more particularly, to systems, circuits, and methods for determining a status of fuses.

BACKGROUND OF THE DISCLOSURE

An increasing number of control modules are needed to monitor voltage levels in today's modern vehicles. One existing design uses one digital input port to detect the voltage of a single node. Increasing the number of ports may thus require the use of one or more multiplexers, resulting in a more difficult layout and increased cost.

SUMMARY

In view of the foregoing, described herein are systems, circuits, and methods for determining a status of fuses. In one approach, a system may include a first fuse electrically connected to a first node and to a first resistor, and a second fuse electrically connected to a second node and a second resistor, wherein the first and second fuses are in parallel connection to a same port of a multiplexer. The system may further include a controller communicably connected with the multiplexer, the controller operable to read a voltage level of the first and second nodes.

In another approach, a circuit may include a first fuse electrically connected between a first node and to a first resistor, and a second fuse electrically connected between a second node and a second resistor, wherein the first and second fuses are in parallel connection to a same port of a multiplexer, and wherein the multiplexer is communicably connected with a controller operable to read a voltage level of the first and second nodes.

In yet another approach, a method for determining a status of a fuse may include electrically connecting a first fuse between a first node and a first resistor, and electrically connecting a second fuse between a second node and a second resistor, wherein the first and second fuses are in parallel connection to a same port of a multiplexer. The method may further include electrically connecting a controller with the multiplexer, and reading, by the controller, a voltage level of the first and second nodes. The method may further include determining whether the first or second fuses are open by comparing the voltage level of the first and second nodes to a predetermined voltage level.

Figure 1:
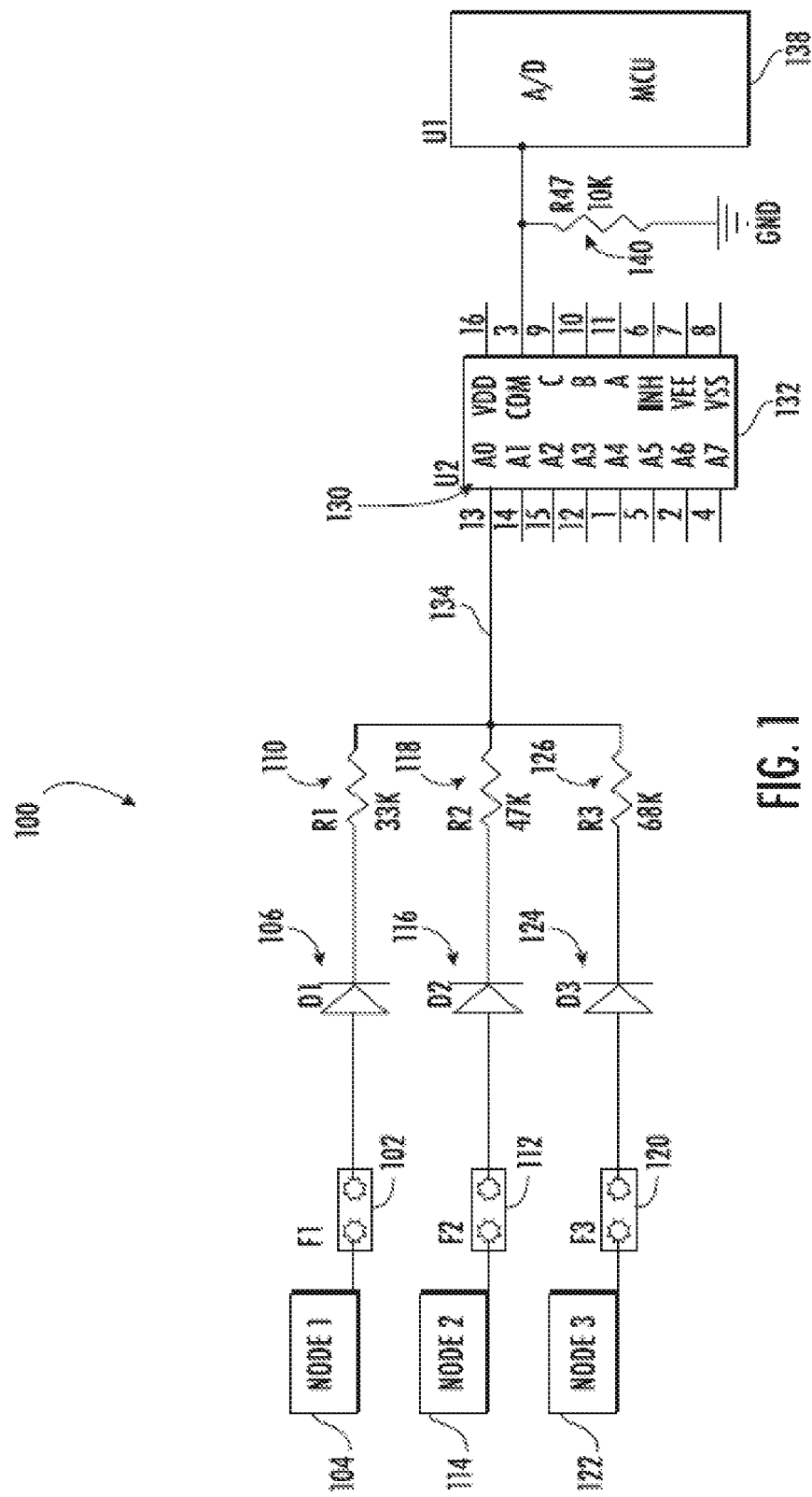
FIG. 1 is a schematic of a system/circuit including for determining a status of fuses according to exemplary embodiments.

The drawings are not necessarily to scale. The drawings are merely representations, not intended to portray specific parameters of the disclosure. The drawings are intended to depict typical embodiments of the disclosure, and therefore should not be considered as limiting in scope. In the drawings, like numbering represents like elements.

Furthermore, certain elements in some of the figures may be omitted, or illustrated not-to-scale, for illustrative clarity. Furthermore, for clarity, some reference numbers may be omitted in certain drawings.

DETAILED DESCRIPTION

Embodiments in accordance with the present disclosure will now be described more fully hereinafter with reference to the accompanying drawings. The system/circuit and methods may be embodied in many different forms and should not be construed as being limited to the embodiments set forth herein. Rather, these embodiments are provided so that this disclosure will be thorough and complete, and will fully convey the scope of the system and method to those skilled in the art.

As mentioned above, currently existing voltage monitoring approaches use one digital input port to detect voltage of a single node. A multiplexer may be added, which is a simple way to expand the I/O port of a control unit, but the multiplexer can't reduce the I/O quantity for a COM port to the control unit. Furthermore, one multiplexer can monitor no more than eight nodes. As a result, current art systems may require 6-8 multiplexers for a single control module. However, an excessive number of multiplexers requires too much space on a printed circuit board (PCB), which makes design difficult and expensive.

Embodiments herein advantageously provide step voltage identification using a single port to monitor multiple nodes (e.g., 3 nodes). This approach can effectively identify the status of each node, thereby reducing multiplexer costs and saving space on the PCB.

Referring now to FIG. 1, a schematic of a circuit/system (hereinafter "system") 100 according to embodiments of the present disclosure will be described. In exemplary embodiments, the system 100 may include a first fuse 102 connected between a first node 104 and a first diode 106. Connected in series with the first fuse 102 and the first diode 106 is a first resistor 110. In some embodiments, the first resistor 110 has a resistance value of 33K. The system 100 may further include a second fuse 112 connected between a second node 114 and a second diode 116. Connected in series with the second fuse 112 and the second diode 116 is a second resistor 118. In some embodiments, the second resistor 118 has a resistance value of 47K. The system 100 may further include a third fuse 120 connected between a third node 122 and a third diode 124. Connected in series with the third fuse 120 and the third diode 122 is a third resistor 126. In some embodiments, the third resistor 126 has a resistance value of 68K. As shown, the first resistor 110, the second resistor 118, and the third resistor 126 are electrically connected in parallel to a same port (AO) 130 of a multiplexer 132. Similarly, the first diode 106, the second diode 116, and the third diode 124 are electrically connected in parallel.

The multiplexer 132 may receive a status signal 134 representing a state of each of the first fuse 102, the second fuse 112, and the third fuse 120. As further shown, the multiplexer 132 may be connected to a processor or controller 138, wherein a fourth resistor 140 is connected between the multiplexer 132 and the controller 138. Although non-limiting, the fourth resistor 140 may have a resistance value of 10K.

The controller 138 may include processing circuitry for storing and processing information, including a microprocessor and memory. It is understood that the processing circuitry may contain additional components, including processors, memories, error and parity/CRC checkers, data encoders, anticollision algorithms, controllers, command decoders, security primitives and tamperproofing hardware, as necessary to perform the functions described herein.

During use, the controller 138 is operable to read voltage levels of the first node 104, the second node 114, and the third node 122. In some embodiments, the controller 138 is further operable to determine the AD value, i.e., the value obtained by converting an analog value of the voltage of the nodes into a digital value. Advantageously, the controller 138 can utilize a single port 130 of the multiplexer 132 to monitor all three nodes at same time. Although not specifically shown, the controller 138 can monitor a total of twenty-four (24) nodes because eight (8) ports (e.g., A0-A7) are present on the multiplexer 132.

In one example, the controller 138 can identify if any of the first, second, or third fuses are open. By setting the resistance values (e.g., R1/R2/R3 as 33K/47K/68K), if any fuse is open, the overall resistance at the same port 130 will be different and the controller 138 will get a different voltage and/or AD value from predetermined or expected values. So the system 100 can find which node or nodes are open. Although non-limiting, the resistance values (e.g., 33K/47K/68K) may also be optimized values, causing the system 100 to have more redundancy for component tolerance and voltage fluctuation. For example, the system 100 can tolerate +/−3.4% for a given component (e.g., the 33K/47K/68K resistors). With +/−1% component tolerance, the system can also tolerate +/−6% voltage fluctuation. In some embodiments, when the component is a diode, the main tolerance may be the forward voltage drop (Vf) of the diode. When the component is a resistor, the main tolerance may be the resistance. When the component is a multiplexer, the main tolerance is the channel ON-resistance (Ron) when the channel is switched on. When the component is a controller, the main tolerance is the reference voltage used for AD conversion.

Figure 2:
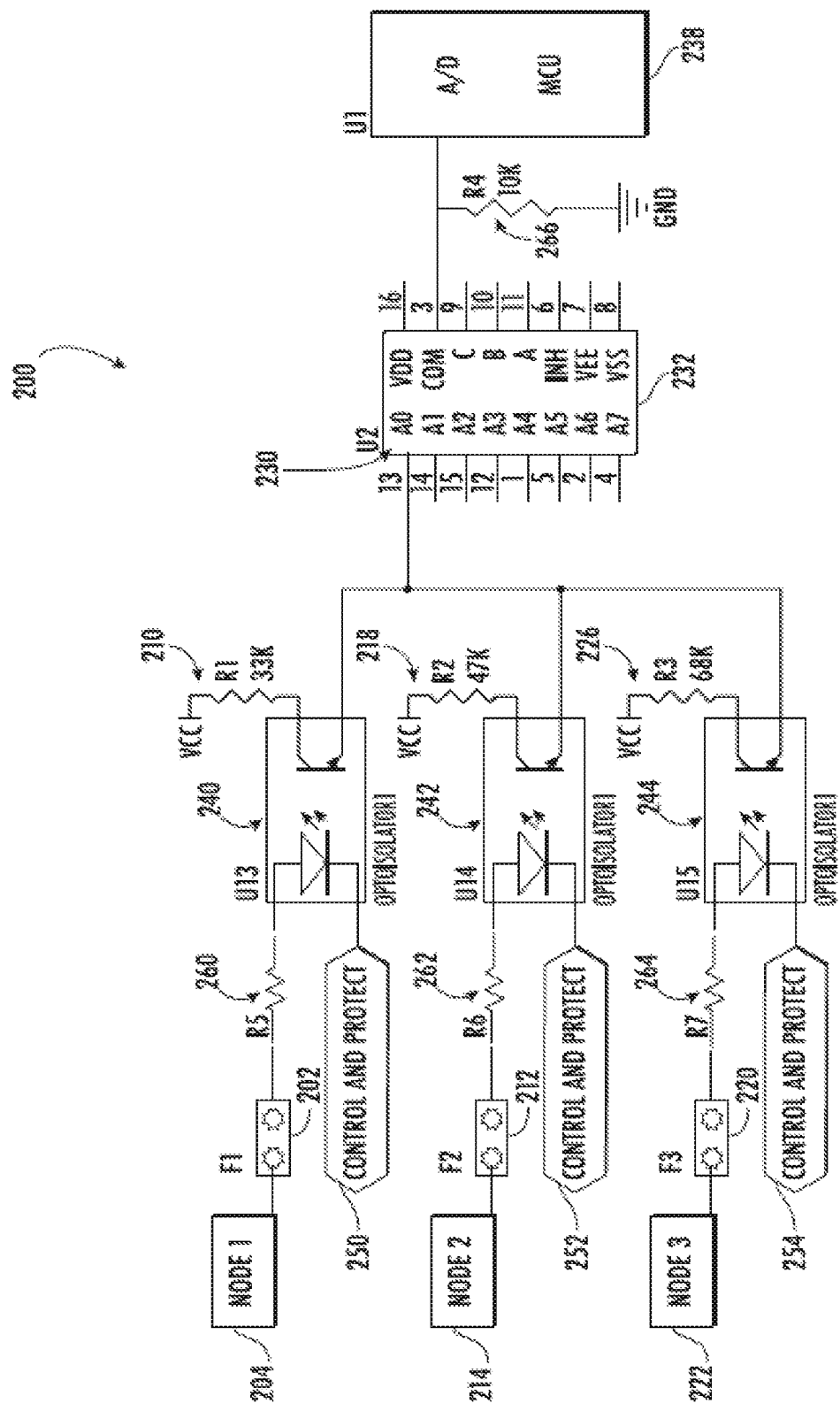
FIG. 2 is a schematic of a system/circuit including for determining a status of fuses according to exemplary embodiments.

Referring now to FIG. 2, a schematic of a circuit/system (hereinafter "system") 200 according to embodiments of the present disclosure will be described. In exemplary embodiments, the system 200 may include a first fuse 202 connected between a first node 204 and a first resistor 210. In some embodiments, the first resistor 210 has a resistance value of 33K. The system 200 may further include a second fuse 212 connected between a second node 214 and a second resistor 218. In some embodiments, the second resistor 218 has a resistance value of 47K. The system 200 may further include a third fuse 220 connected between a third node 222 and a third resistor 226. In some embodiments, the third resistor 226 has a resistance value of 68K. As shown, the first resistor 210, the second resistor 218, and the third resistor 226 are electrically connected in parallel to a same port (AO) 230 of a multiplexer 232.

The system 200 may further include a first optoisolator 240 electrically connected to the first resistor 210, a second optoisolator 242 electrically connected to the second resistor 218, and a third optoisolator 244 electrically connected to the third resistor 226. The system 200 may further include a first control and protect circuit 250 (e.g., a MOSFET and transient voltage suppressor) connected to the first optoisolator 240, a second control and protect circuit 252 connected to the second optoisolator 242, and a third control and protect circuit 256 connected to the third optoisolator 244.

As further shown, a fifth resistor 260 may be positioned between the first fuse 202 and the first optoisolator 240 to protect the diode of the first optoisolator 240, a sixth resistor 262 may be positioned between the second fuse 212 and the second optoisolator 242 to protect the diode of the second optoisolator 242, and a seventh resistor 264 may be positioned between the third fuse 220 and the third optoisolator 244 to protect the diode of the third optoisolator 244. A fourth resistor 266 may be positioned between the multiplexer 232 and a controller 238.

During an example operation of the system 200, if the first fuse 202, the second fuse 212, and the third fuse 220 are all normal/closed, the first resistor 210, the second resistor 218, and the third resistor 226 are in parallel connection with VCC, and the equivalent resistance is smallest. The equivalent resistance is in series with the fourth resistor 266, and supply a partial, analog voltage to port 230.

If one or more fuses are open, the associated resistor will be open from the port 230, so the equivalent resistance will be bigger, and the partial voltage on the port 230 will be lower. When different fuses open, a different partial voltage is supplied to the port 230. The controller 238 can then identify which fuse is open based on the partial voltage at the port 230.

Figure 3:
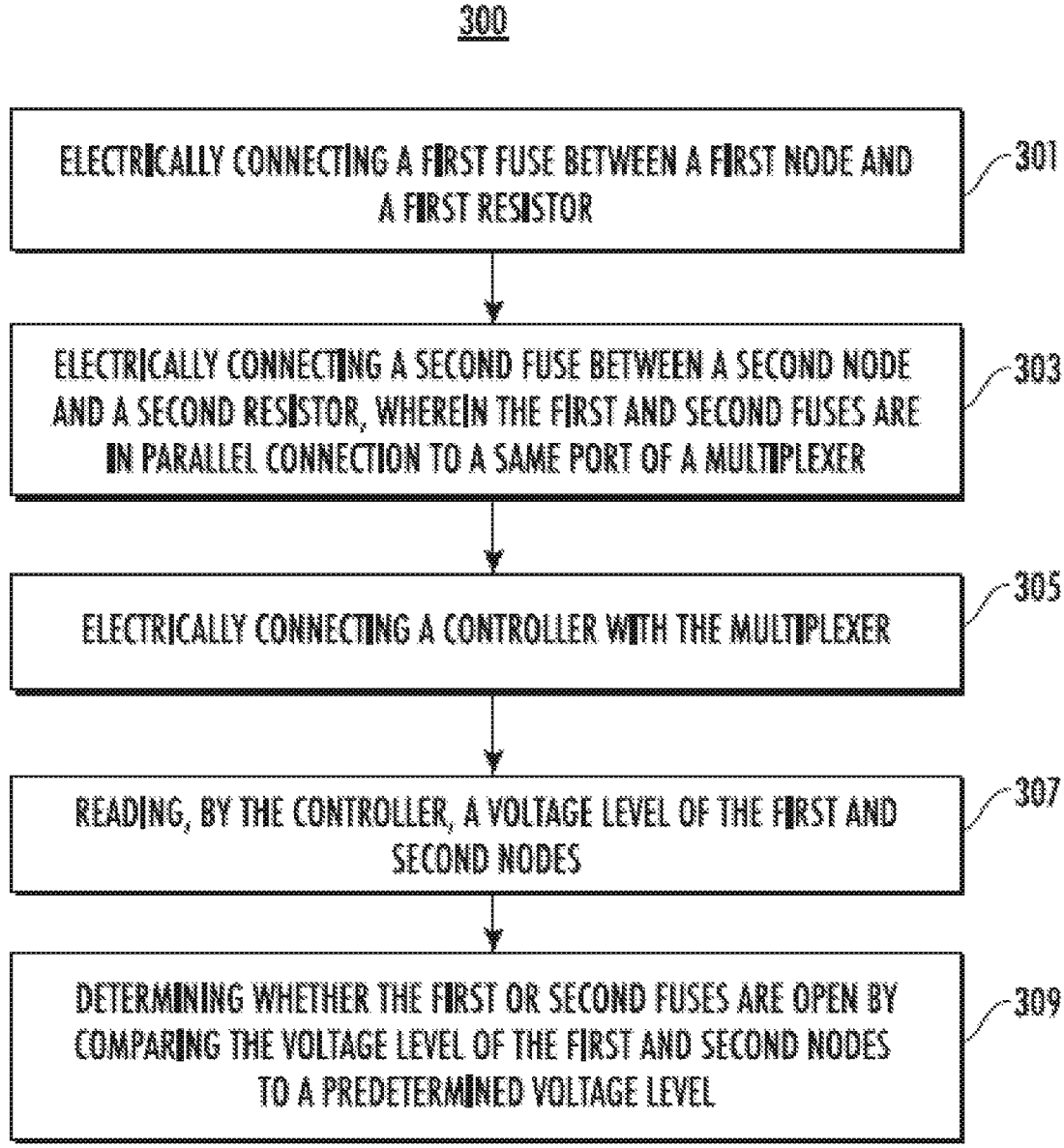
FIG. 3 is a method for determining a status of fuses according to exemplary embodiments.

Turning now to FIG. 3, a method 300 for determining a status of a fuse according to exemplary embodiments will be described in greater detail. As shown, at block 301, the method 300 may include electrically connecting a first fuse between a first node and a first resistor. At block 303, the method 300 may include electrically connecting a second fuse between a second node and a second resistor, wherein the first and second fuses are in parallel connection to a same port of a multiplexer. In some embodiments, the method 300 may include electrically connecting a third fuse between a third node and a third resistor, wherein the third fuse is in parallel connection with the first fuse and the second fuse, and wherein the third fuse is electrically connected to the same port of the multiplexer At block 305, the method 300 may include electrically connecting a controller with the multiplexer. At block 307, the method 300 may include reading, by the controller, a voltage level of the first and second nodes. At block 309, the method 300 may include determining whether the first or second fuses are open by comparing the voltage level of the first and second nodes to a predetermined voltage level. In some embodiments, the method 300 may include reading, by the controller, a voltage level of the third node, and determining whether the first fuse, the second fuse, or the third fuse are open by comparing the voltage level of the first, second, and third nodes to the predetermined voltage level. In some embodiments, the first resistor, the second resistor, and the third resistor each have different resistor values.

In some embodiments, the method 300 may include electrically connecting a first diode between the first fuse and the first resistor, electrically connecting a second diode between the second fuse and the second resistor, and electrically connecting a third diode between the third fuse and the third resistor, wherein the first diode, the second diode, and the third diode are electrically connected in parallel.

In some embodiments, the method 300 may further include electrically connecting a first optoisolator to the first resistor, a second optoisolator to the second resistor, and a third optoisolator to the third resistor. In some embodiments, the method 300 may further include electrically connecting a fifth resistor between the first optoisolator and the first fuse, a sixth resistor between the second optoisolator and the second fuse, and a seventh resistor between the third optoisolator and the third fuse.

Although the illustrative method 300 is described above as a series of acts or events, the present disclosure is not limited by the illustrated ordering of such acts or events unless specifically stated. For example, some acts may occur in different orders and/or concurrently with other acts or events apart from those illustrated and/or described herein, in accordance with the disclosure. In addition, not all illustrated acts or events may be required to implement a methodology in accordance with the present disclosure.

As used herein, an element or step recited in the singular and proceeded with the word "a" or "an" is understood as not excluding plural elements or steps, unless such exclusion is explicitly recited. Furthermore, references to "one embodiment" of the present disclosure are not intended to be interpreted as excluding the existence of additional embodiments also incorporating the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions and are both conjunctive and disjunctive in operation. For example, expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are just used for identification purposes to aid the reader's understanding of the present disclosure. The directional references do not create limitations, particularly as to the position, orientation, or use of the disclosure. Connection references (e.g., attached, coupled, connected, and joined) are to be construed broadly and may include intermediate members between a collection of elements and relative movement between elements unless otherwise indicated. As such, connection references do not necessarily infer two elements are directly connected and in fixed relation to each other.

Furthermore, identification references (e.g., primary, secondary, first, second, third, fourth, etc.) are not intended to connote importance or priority, and are used to distinguish one feature from another. The drawings are for purposes of illustration, and the dimensions, positions, order and relative sizes reflected in the drawings attached hereto may vary.

Furthermore, the terms "substantial" or "approximately," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

The invention claimed is:

1. A system, comprising:
   a first fuse electrically connected in series between a first node and to a first resistor;
   a second fuse electrically connected in series between a second node and a second resistor, wherein the first and second fuses are in parallel connection to a same port of a multiplexer, and wherein the first resistor is positioned between the first fuse and the multiplexer; and
   a controller communicably connected with the multiplexer, the controller operable to read a voltage level of the first and second nodes.

2. The system of claim 1, further comprising a third fuse electrically connected to a third node and to a third resistor, wherein the third fuse is in parallel connection with the first fuse and the second fuse, and wherein the third fuse is electrically connected to the same port of the multiplexer.

3. The system of claim 2, wherein the controller is operable to read a voltage level of the third node.

4. The system of claim 2, further comprising:
   a first diode connected between the first fuse and the first resistor;
   a second diode connected between the second fuse and the second resistor; and
   a third diode connected between the third fuse and the third resistor, wherein the first diode, the second diode, and the third diode are electrically connected in parallel.

5. The system of claim 2, further comprising a first optoisolator electrically connected to the first resistor, a second optoisolator electrically connected to the second resistor, and a third optoisolator electrically connected to the third resistor.

6. The system of claim 5, further comprising a first control and protect circuit connected to the first optoisolator, a second control and protect circuit connected to the second optoisolator, and a third control and protect circuit connected to the third optoisolator.

7. The system of claim 5, further comprising a fifth resistor between the first optoisolator and the first fuse, a sixth resistor between the second optoisolator and the second fuse, and a seventh resistor between the third optoisolator and the third fuse.

8. The system of claim 2, wherein the first resistor, the second resistor, and the third resistor each have different resistor values.

9. A circuit, comprising:
   a first fuse electrically connected in series between a first node and to a first resistor; and
   a second fuse electrically connected in series between a second node and a second resistor, wherein the first and second fuses are in parallel connection to a same port of a multiplexer, wherein the first resistor is positioned between the first fuse and the multiplexer, and wherein the multiplexer is communicably connected with a controller operable to read a voltage level of the first and second nodes.

10. The circuit of claim 9, further comprising a third fuse electrically connected between a third node and to a third resistor, wherein the third fuse is in parallel connection with the first fuse and the second fuse, and wherein the third fuse is electrically connected to the same port of the multiplexer.

11. The circuit of claim 10, further comprising:
a first diode connected between the first fuse and the first resistor;
a second diode connected between the second fuse and the second resistor; and
a third diode connected between the third fuse and the third resistor, wherein the first diode, the second diode, and the third diode are electrically connected in parallel.

12. The circuit of claim 10, further comprising a first optoisolator electrically connected to the first resistor, a second optoisolator electrically connected to the second resistor, and a third optoisolator electrically connected to the third resistor.

13. The circuit of claim 12, further comprising a fourth resistor between the controller and the multiplexer.

14. The circuit of claim 12, further comprising a fifth resistor between the first optoisolator and the first fuse, a sixth resistor between the second optoisolator and the second fuse, and a seventh resistor between the third optoisolator and the third fuse.

15. The circuit of claim 10, wherein the first resistor, the second resistor, and the third resistor each have different resistor values.

16. A method for determining a status of a fuse, comprising:
electrically connecting, in series, a first fuse between a first node and a first resistor;
electrically connecting, in series, a second fuse between a second node and a second resistor, wherein the first resistor is positioned between the first fuse and the multiplexer, and wherein the first and second fuses are in parallel connection to a same port of a multiplexer; and
electrically connecting a controller with the multiplexer;
reading, by the controller, a voltage level of the first and second nodes; and
determining whether the first or second fuses are open by comparing the voltage level of the first and second nodes to a predetermined voltage level.

17. The method of claim 16, further comprising:
electrically connecting a third fuse between a third node and a third resistor, wherein the third fuse is in parallel connection with the first fuse and the second fuse, and wherein the third fuse is electrically connected to the same port of the multiplexer;
reading, by the controller, a voltage level of the third node; and
determining whether the first fuse, the second fuse, or the third fuse are open by comparing the voltage level of the first, second, and third nodes to the predetermined voltage level, wherein the first resistor, the second resistor, and the third resistor each have different resistor values.

18. The method of claim 17, further comprising:
electrically connecting a first diode between the first fuse and the first resistor;
electrically connecting a second diode between the second fuse and the second resistor; and
electrically connecting a third diode between the third fuse and the third resistor, wherein the first diode, the second diode, and the third diode are electrically connected in parallel.

19. The method of claim 18, further comprising electrically connecting a first optoisolator to the first resistor, a second optoisolator to the second resistor, and a third optoisolator to the third resistor.

20. The method of claim 19, further comprising further comprising electrically connecting a fifth resistor between the first optoisolator and the first fuse, a sixth resistor between the second optoisolator and the second fuse, and a seventh resistor between the third optoisolator and the third fuse.

* * * * *